(12) United States Patent
Huang

(10) Patent No.: US 12,120,873 B2
(45) Date of Patent: Oct. 15, 2024

(54) THREE-DIMENSIONAL FLASH MEMORY AND METHOD OF FORMING THE SAME

(71) Applicant: MACRONIX International Co., Ltd., Hsinchu (TW)

(72) Inventor: Chia-Tze Huang, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 455 days.

(21) Appl. No.: 17/483,505

(22) Filed: Sep. 23, 2021

(65) Prior Publication Data

US 2023/0085996 A1 Mar. 23, 2023

(51) Int. Cl.
| | |
|---|---|
| *H10B 43/27* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; H10B 43/20
See application file for complete search history.

(56) References Cited

U.S. PATENT DOCUMENTS

2021/0233925 A1* 7/2021 Kashima ................ H10B 43/10

FOREIGN PATENT DOCUMENTS

| TW | 201941410 | 10/2019 |
|---|---|---|
| TW | 202101668 | 1/2021 |
| TW | 202109848 | 3/2021 |

OTHER PUBLICATIONS

"Office Action of Taiwan Counterpart Application", issued on Sep. 5, 2022, p. 1-p. 7.

* cited by examiner

*Primary Examiner* — Mohammad A Rahman
(74) *Attorney, Agent, or Firm* — J.C. PATENTS

(57) ABSTRACT

Provided is a three-dimensional flash memory including a substrate, a stack structure, a stop layer, two slit trenches, a plurality of vertical channel structures, and a plurality of slit holes. The stack structure is disposed on the substrate. The stack structure includes a plurality of dielectric layers and a plurality of conductive layers stacked alternately. The stop layer is disposed between the substrate and the stack structure. The two slit trenches penetrate through the stack structure to expose the stop layer. The vertical channel structures are disposed between the two slit trenches and penetrate through the stack structure and the stop layer. The slit holes are discretely disposed between the vertical channel structures, and penetrate through the stack structure to expose the stop layer. A method of forming the three-dimensional flash memory is also provided.

20 Claims, 11 Drawing Sheets

THREE-DIMENSIONAL FLASH MEMORY AND METHOD OF FORMING THE SAME

BACKGROUND OF THE INVENTION

Field of the Invention

The present invention relates to a memory and a method of forming the same, and more particularly to a 3D flash memory and a method of forming the same.

Description of Related Art

A non-volatile memory (such as a flash memory) is a memory widely used in personal computers and other electronic devices because it has an advantage that the stored data does not disappear after being powered off.

The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY OF THE INVENTION

The invention provides a three-dimensional (3D) flash memory including a substrate, a stack structure, two adjacent slit trenches, a plurality of vertical channel structures, and a plurality of slit holes. The stack structure is disposed on the substrate. The stack structure includes a plurality of dielectric layers and a plurality of conductive layers stacked alternately. The two adjacent slit trenches penetrate through the stack structure. The two adjacent slit trenches have an average width 30w. The vertical channel structures are disposed between the two adjacent slit trenches and penetrate through the stack structure. The slit holes are discretely disposed between the vertical channel structures, and penetrate through the stack structure. The slit holes have an average width W greater than or equal to the average width 30w of the two adjacent slit trenches.

The invention provides a method of forming a 3D flash memory including: forming a stop layer and a stack structure on a substrate, wherein the stack structure comprises a plurality of dielectric layers and a plurality of sacrificial layers stacked alternately; forming a plurality of first openings in the stack structure and the stop layer; respectively forming a plurality of vertical channel structures in the plurality of first openings; forming a plurality of second openings exposing the stop layer in the stack structure, wherein the plurality of second openings at least comprise two adjacent slit trenches having an average width 30w and a plurality of slit holes having have an average width W, the plurality of vertical channel structures are formed between the two slit trenches, and the plurality of slit holes are discretely formed between the plurality of vertical channel structures, wherein the average width W of the plurality of slit holes is greater than or equal to the average width 30w of the two adjacent slit trenches; and performing a gate replacement process through the plurality of second openings, so that the plurality of sacrificial layers are replaced by a plurality of conductive layers.

Based on the above, in the present embodiment, a plurality of slit holes are discretely formed between the plurality of vertical channel structures to increase the removal efficiency of the sacrificial layers and the filling efficiency of the conductive layers in the gate replacement process, thereby improving the yield of the 3D flash memory. In this case, in the present embodiment, the process bottleneck of the current memory not only can be solved, but also increase the number of memory cells per chip area, thereby enhancing the integration and the area utilization of the memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
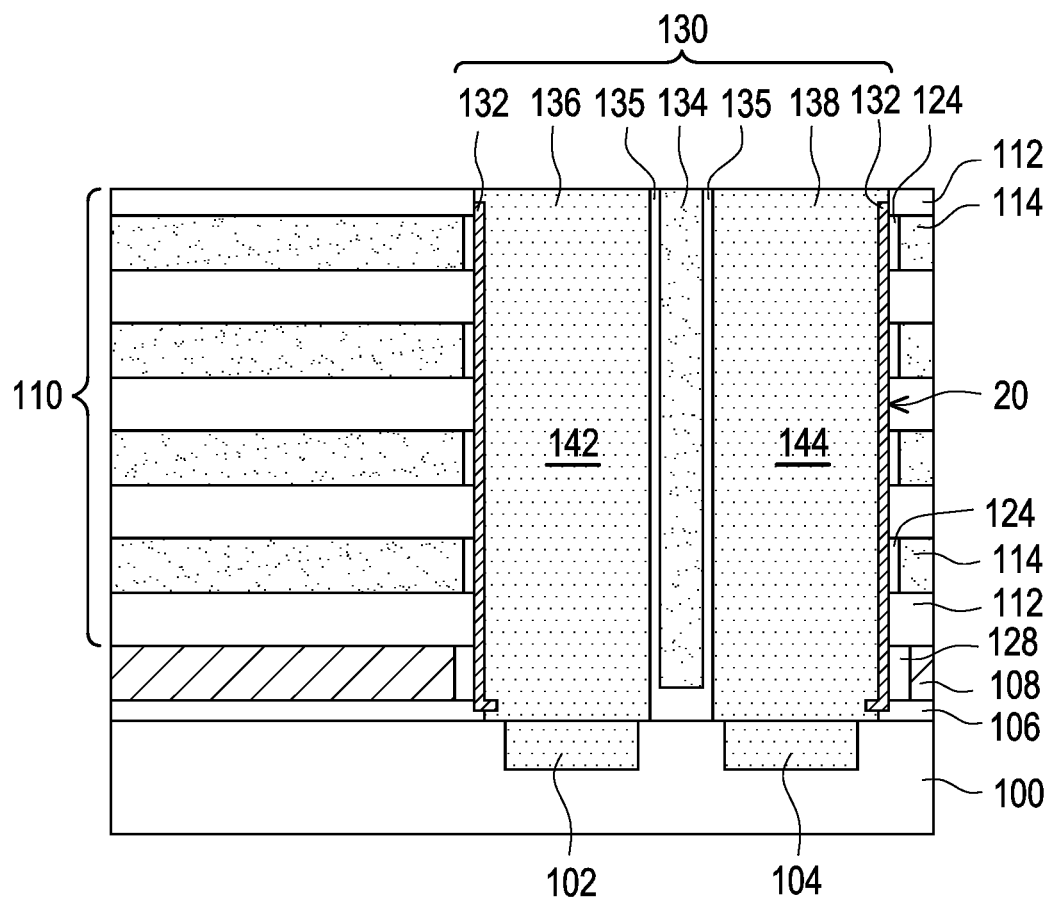
FIG. 1, FIG. 2, FIG. 3, FIG. 4A, and FIG. 5 are schematic cross-sectional views illustrating a manufacturing process of a 3D AND flash memory according to an embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1, FIG. 2, FIG. 3, FIG. 4A, and FIG. 5 are schematic cross-sectional views illustrating a manufacturing process of a 3D AND flash memory according to an embodiment of the invention. FIG. 4B is a schematic plan view along a line A-A of FIG. 4A. The following embodiment is illustrated by using the 3D AND flash memory as an example, but the invention is not limited thereto. In other embodiments, the resulting memory structure may also be a 3D NAND flash memory or a 3D NOR flash memory.

Referring to FIG. 1, first, an initial structure 10 is provided. Specifically, the initial structure 10 may include a substrate 100, a cap layer 106, a stop layer 108, a stack structure 110, and a vertical channel structure 130. In an embodiment, the substrate 100 includes a dielectric substrate. The dielectric substrate may be a dielectric layer formed on a silicon substrate, such as a silicon oxide layer. In an embodiment, a material of the cap layer 106 includes a dielectric material, such as silicon oxide. In an embodiment, a material of the stop layer 108 includes a doped polysilicon material. For example, the stop layer 108 may be a P-type doped (P+) polysilicon layer.

The stack structure 110 may include a plurality of dielectric layers 112 and a plurality of sacrificial layers 114 stacked alternately. In an embodiment, the dielectric layers 112 and the sacrificial layers 114 may be different dielectric materials. For example, the dielectric layers 112 may be silicon oxide layers; and the sacrificial layers 114 may be silicon nitride layers. The number of the dielectric layers 112 and the sacrificial layers 114 may be adjusted by the needs, the invention is not limited thereto.

The vertical channel structure 130 may be formed in an opening 20. As shown in FIG. 1, the opening 20 (also referred to as a first opening) may penetrate through the stack structure 110, the stop layer 108, the cap layer 106, and partially extend into the substrate 100. Specifically, the vertical channel structure 130 may include the channel layer 132, the insulating pillar 134, the dielectric material 135, the first S/D pillar 136, and the second S/D pillar 138. The first S/D pillar 136 and the second S/D pillar 138 penetrate through the dielectric material 135 and partially extend into the substrate 100. In the present embodiment, the polysilicon materials 142 and 144 and the polysilicon layers 102 and 104 have the same material, such as N-type doped (N+) polysilicon materials. In this case, the first S/D pillar 136 may include the polysilicon layer 102 (also referred to as a first portion) embedded in the substrate 100 and the polysilicon material 142 (also referred to as a second portion) disposed on the polysilicon layer 102. Likewise, the second S/D pillar 138 may also include the polysilicon layer 104 (also referred to as a first portion) embedded in the substrate 100 and the polysilicon material 144 (also referred to as a second portion) disposed on the polysilicon layer 104. In the present embodiment, the cross-sectional area of the polysilicon layers 102 and 104 may be less than the cross-sectional area of the polysilicon materials 142 and 144. That is, the perimeter of the polysilicon layers 102 and 104 may be located within the range of the polysilicon materials 142 and 144, as shown in FIG. 4B. The insulating pillar 134 is disposed between the first S/D pillar 136 and the second S/D pillar 138 to separate the first S/D pillar 136 from the second S/D pillar 138. In addition, the channel layer 132 is over a sidewall of the opening 20 and may laterally surround the insulating pillar 134, the dielectric material 135, the first S/D pillar 136 and the second S/D pillar 138.

As shown in FIG. 1, the initial structure 10 may optionally include a plurality of oxide layers 124 and 128. The oxide layer 124 may be disposed between the sacrificial layers 114 and the channel layer 132, and the oxide layer 128 may be disposed between the stop layer 108 and the channel layer 132. The oxide layer 124 may be formed through performing an oxidation treatment on a sidewall of the sacrificial layers 114, and the oxide layer 128 may be formed through performing the oxidation treatment on a sidewall of the stop layer 108. In an embodiment, the oxide layers 124 and 128 have different materials. For example, the oxide layer 124 may be a silicon oxynitride layer, and the oxide layer 128 may be a silicon oxide layer. In one embodiment, the oxidation treatment includes thermal oxidation, wet oxidation, or a combination thereof. It should be noted that since an oxidation rate of the stop layer 108 is faster than or greater than an oxidation rate of the sacrificial layers 114, a thickness of the oxide layer 128 may be greater than a thickness of the oxide layer 124.

After forming the vertical channel structure 130, a gate replacement process may be performed to replace the sacrificial layers 114 in the stack structure 110 by a plurality of conductive layers 154, as shown in FIG. 2 to FIG. 4B.

Figure 2:
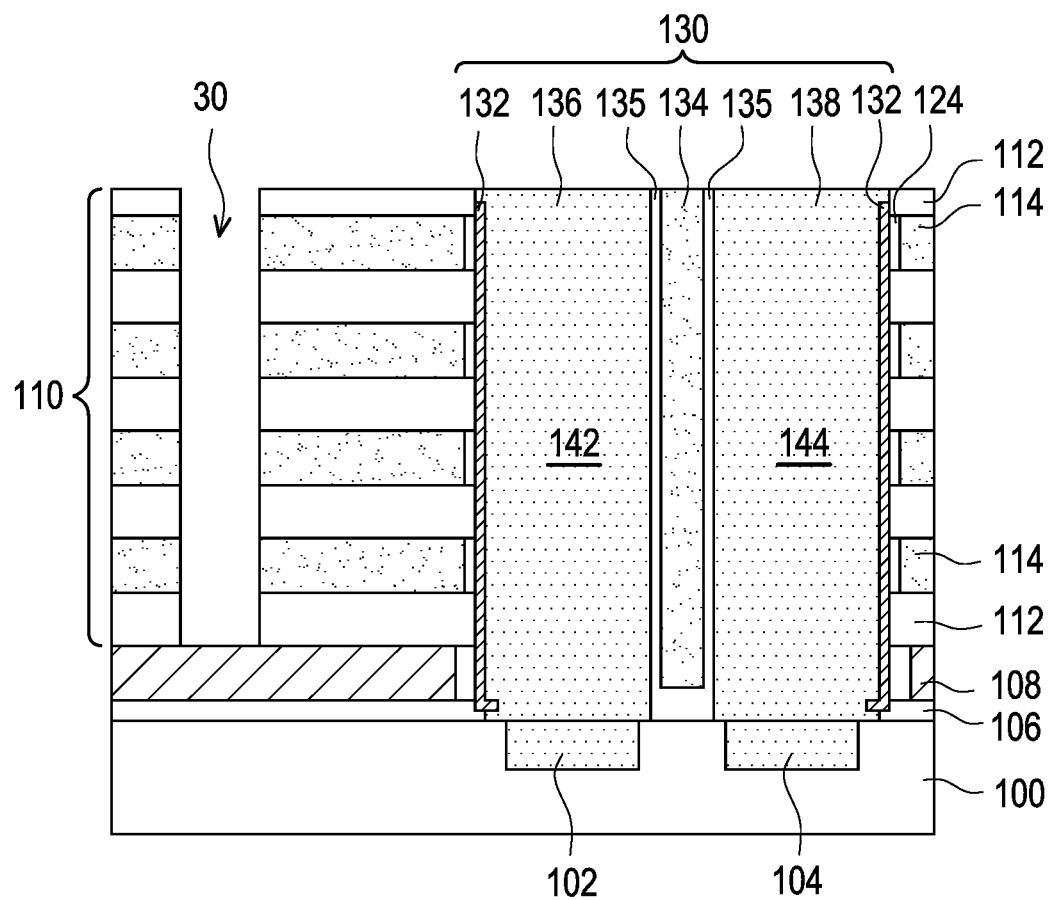

First, referring to FIG. 2, an opening 30 (also referred to as a second opening) is formed in the stack structure 110 aside the vertical channel structure 130. The opening 30 penetrates through the stack structure 110 to stop on the stop layer 108 and expose the stop layer 108. Although a bottom surface of the opening 30 shown in FIG. 2 is level with a top surface of the stop layer 108, the present invention is not limited thereto. In other embodiments, the bottom surface of the opening 30 may be higher than or lower than the top surface of the stop layer 108.

Figure 8A:
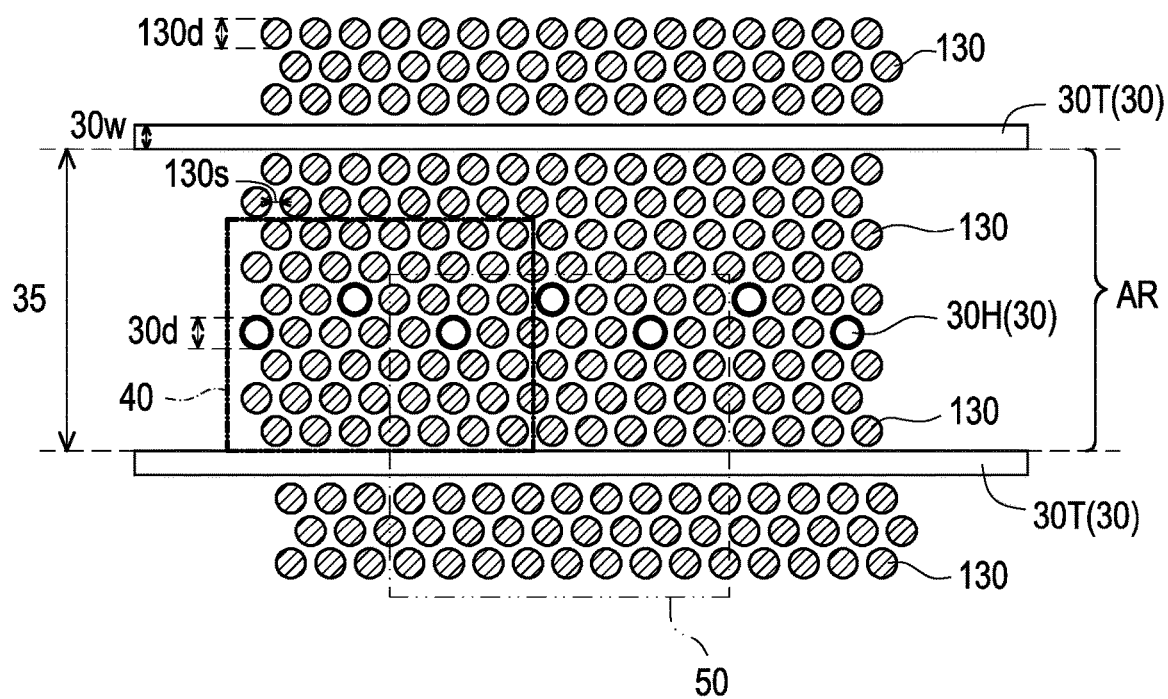
FIG. 8A illustrates a layout of the arrangement of slit holes according to an embodiment of the invention.

It should be noted that, in the present embodiment, the opening 30 at least includes two slit trenches 30T and a plurality of slit holes 30H, as shown in FIG. 8A. Specifically, from cross-sectional perspective, the slit trenches 30T may penetrate through the stack structure 110 and expose the stop layer 108, as shown by the reference numeral 30 in FIG. 2. From a top view perspective in FIG. 8A, the slit trenches 30T may extend along a X direction and be arranged along a Y direction to divide a plurality of vertical channel structures 130 into a plurality of array regions AR arranged along the Y direction. In such embodiment, the vertical channel structures 130 are formed between two slit trenches 30T. On the other hand, the slit holes 30H may be discretely formed between the vertical channel structures 130 in each array area AR. In the present embodiment, a shape of the slit holes 30H may be a dot shape. In this case, the slit holes 30H may have an average diameter $30d$ greater than or equal to an average width $30w$ of the slit trenches 30T, namely, $30d \geq 30w$. The average diameter $30d$ of the slit holes 30H may be greater than or equal to an average diameter $130d$ of the vertical channel structures 130, namely, $30d \geq 130d$. In an embodiment, the average diameter $130d$ of the vertical channel structures 130 may be between 100 nm and 350 nm.

Referring back to FIG. 8A, generally speaking, if there is no slit holes 30H, a distance 35 between two adjacent slit trenches 30T may be between 1 μm and 20 μm, or less than 200 times of an average diameter $130d$ of the vertical channel structures 130. When the distance 35 between two adjacent slit trenches 30T is too large, it may cause the sacrificial layers 114 in the middle region of the array area AR cannot be completely removed in the subsequent etching process. In this case, the silicon nitride remaining issue will occur in the middle region of the array area AR, which will cause the poor filling issue of the subsequent conductive layer (or gate). Therefore, in the conventional method, the distance 35 between two adjacent slit trenches 30T cannot be increased to accommodate more vertical channel structures 130, so that the integration of memory device cannot be improved.

On the other hand, when the height of the stack structure 110 in FIG. 2 is getting higher, the upper width of the opening 20 will be larger than the lower width thereof due to the high aspect ratio. In the case where the upper width of the opening 20 is too large, an upper spacing $130s$ (as shown in FIG. 8A) between two adjacent vertical channel structures 130 (or two adjacent openings 20) may become too small, which may cause the sacrificial layers 114 here cannot be completely removed in the subsequent etching process. In this case, the silicon nitride remaining issue will occur in the region between two adjacent vertical channel structures 130, which will cause the poor filling issue of the subsequent conductive layer (or gate).

In order to solve the above issues, in the present embodiment, a plurality of slit holes 30H are discretely formed between the plurality of vertical channel structures 130 to increase the removal efficiency of the sacrificial layers 114 and the filling efficiency of the conductive layers 154 (FIG. 4A), thereby improving the yield of memory devices. In this case, the distance 35 between two adjacent slit trenches 30T may be greater than or equal to 20 μm, thereby accommodating more vertical channel structures 130. As such, the present embodiment can also improve the integration of memory devices.

Figure 3:
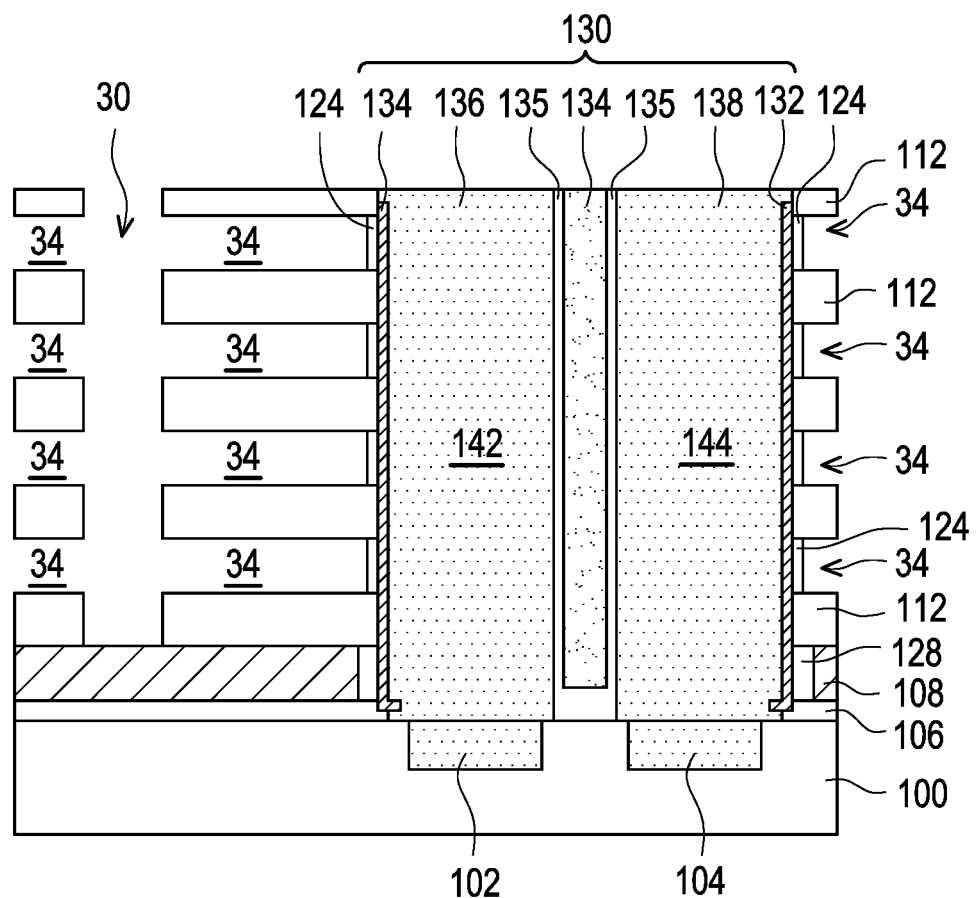

Afterward, referring to FIG. 3, an etching process is performed through the opening 30 to remove the sacrificial layers 114 to form a plurality of gaps 34 between the dielectric layers 112. The gaps 34 laterally expose the oxide layer 124. In other words, the gaps 34 are defined by the dielectric layers 112 and the oxide layer 124. It should be noted that the oxide layer 124 may be regarded as the etching stop layer of the etching process to remove the sacrificial layers 114, so as to avoid over-etching and further damage the channel layer 132. In one embodiment, the etching process may be a wet etching process. For example, when the sacrificial layers 114 are silicon nitride, the etching process may be to use an etching solution containing phosphoric acid and pour the etching solution into the opening 30 (which includes the slit trenches 30T and the slit holes 30H), thereby removing the sacrificial layers 114. Since the etching solution has a high etching selectivity with respect to the sacrificial layers 114, the sacrificial layers 114 may be completely removed, while the dielectric layers 112, the stop layer 108, and the cap layer 106 are not removed or only a small amount of those are removed.

Figure 8B:
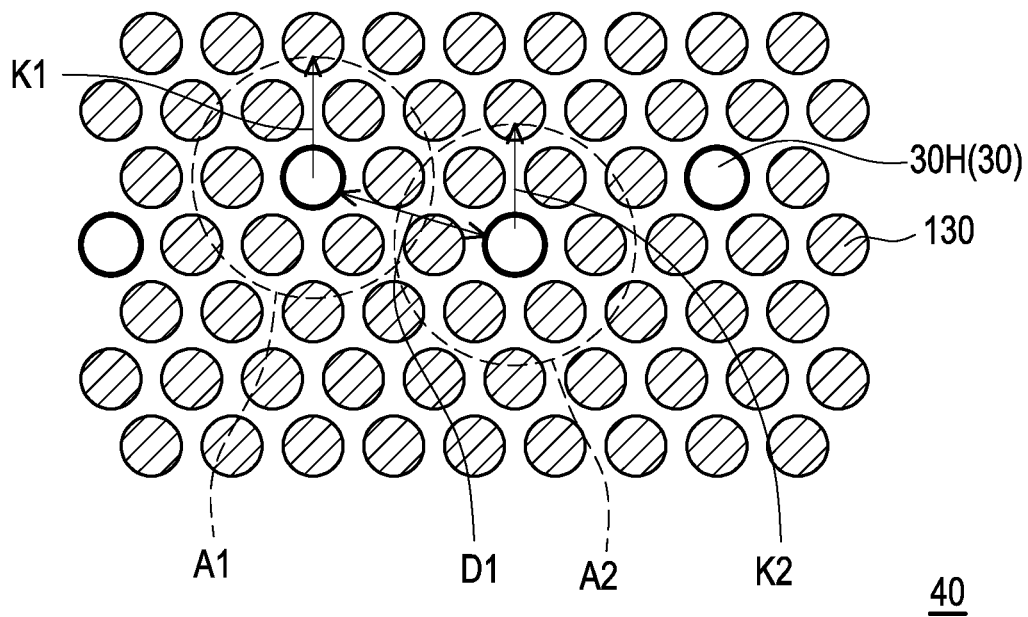
FIG. 8B and FIG. 8C respectively illustrate schematic enlarged views of the regions of FIG. 8A.

FIG. 8B illustrates a schematic enlarged view of the region 40 of FIG. 8A. In an embodiment, as shown in FIG. 8B, a first removal limitation area A1 of a first portion of the plurality of slit holes 30H for removing the sacrificial layers 114 in the gate replacement process has a removal limitation radius K1. A second removal limitation area A2 of a second portion of the plurality of slit holes 30H for removing the sacrificial layers 114 in the gate replacement process has a removal limitation radius K2. The first removal limitation area A1 is partially overlapped with the second removal limitation area A2. That is, a sum of removal limitation length, equal to total removal limitation diameters 2(K1+K2), of two adjacent slit holes 30H for removing the sacrificial layers 114 in the gate replacement process may be greater than a distance D1 between the two adjacent slit holes 30H, namely, 2(K1+K2)>D1. In this case, the present embodiment can ensure that the sacrificial layers 114 located in the middle region of the array area AR are completely removed through the slit holes 30H.

Figure 8C:
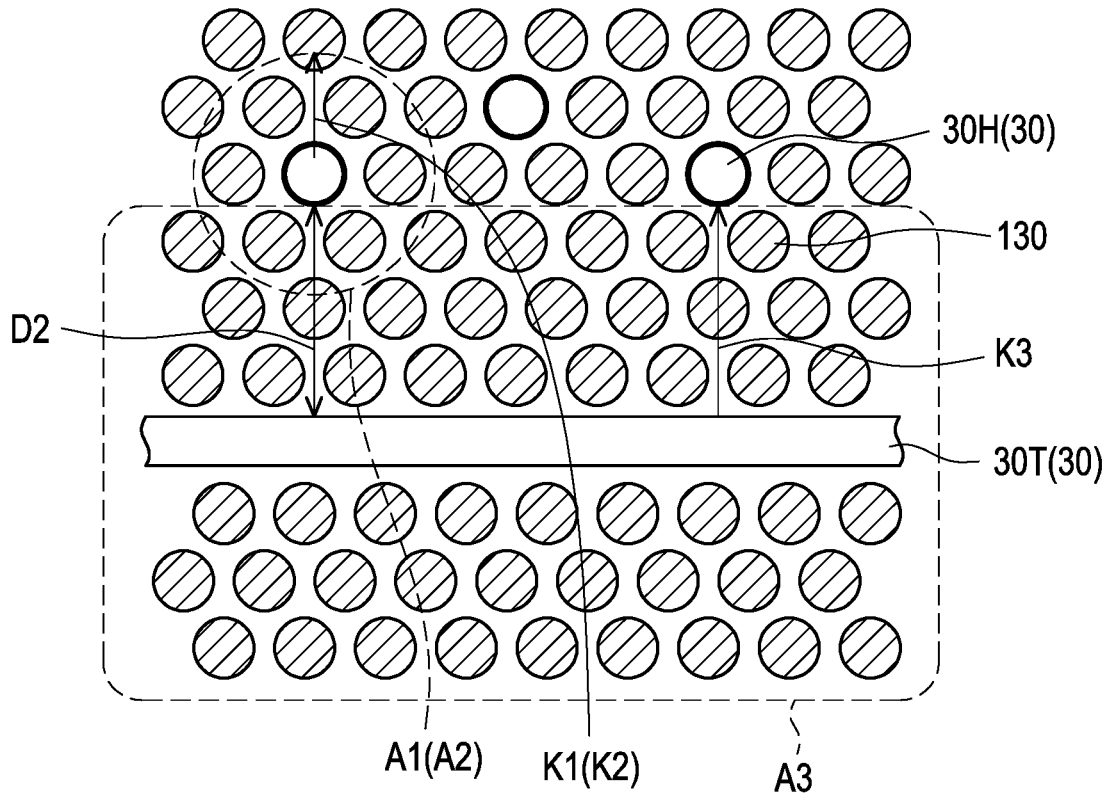

FIG. 8C illustrates a schematic enlarged view of the region 50 of FIG. 8A. In an embodiment, as shown in FIG. 8B and FIG. 8C, a removal limitation area A1/A2 of one of the plurality of slit holes 30H for removing the sacrificial layers 114 in the gate replacement process is partially overlapped with a removal limitation area A3 of one of the two slit trenches 30T for removing the sacrificial layers 114 in the gate replacement process. That is, a sum of removal limitation length (K1+K3) from the slit hole 30H to the slit trench 30T for removing the sacrificial layers 114 in the gate replacement process may be greater than a distance D2 between the slit hole 30H and the slit trench 30T, namely, K1+K3>D2.

From FIGS. 8A to 8C, in the present embodiment, the slit holes 30H discretely disposed between two adjacent slit trenches 30T can be used to remove the sacrificial layers 114 located in the middle region of the array area AR, while the slit trenches 30T are used to remove the sacrificial layers 114 located in the peripheral region of the array area AR. In the case of the slit holes 30H with the slit trenches 30T, the present embodiment can ensure that all sacrificial layers 114 in the array area AR are completely removed through the slit holes 30H and slit trenches 30T. As such, in the present embodiment, the conventional silicon nitride remaining issue not only can be solved, but also increase the number of the vertical channel structures 130 in the array area AR, thereby enhancing the integration and the area utilization of the memory.

FIG. 9 to FIG. 12 illustrate layouts of the arrangements of slit holes according to various embodiments of the invention.

Figure 9:
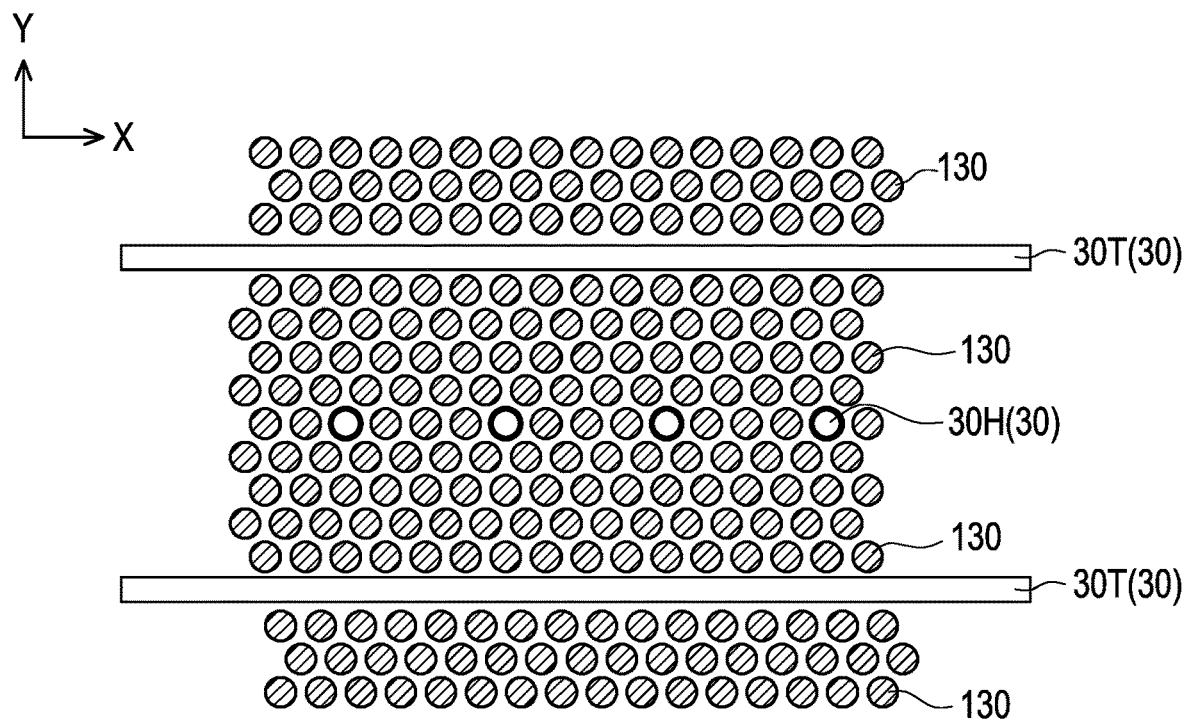
FIG. 9 to FIG. 12 illustrate layouts of the arrangements of slit holes according to various embodiments of the invention.
Figure 10:
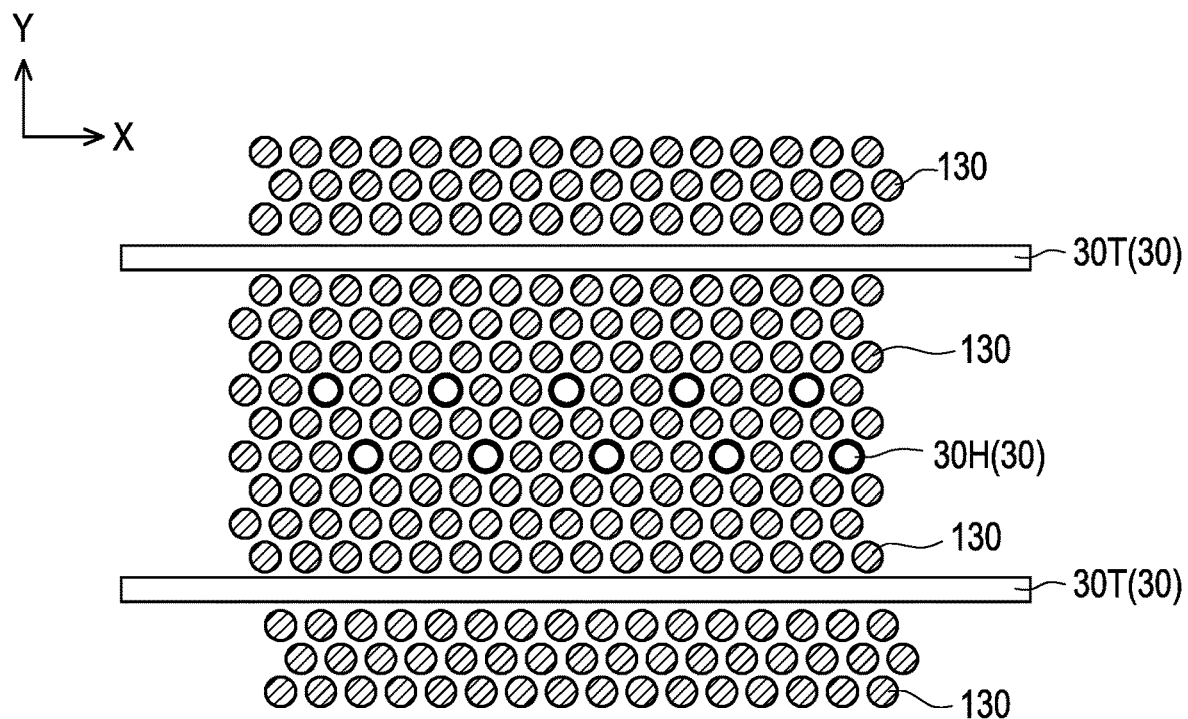

Although FIG. 8A illustrates that the slit holes 30H are arranged in a staggered configuration along the X direction, the present invention is not limited thereto. In other embodiments, the slit holes 30H may also be arranged in a single-line configuration along the X direction, as shown in FIG. 9. In alternative embodiments, the slit holes 30H may also be arranged in a double-line configuration or a multi-line configuration along the X direction, as shown in FIG. 10.

Figure 11:
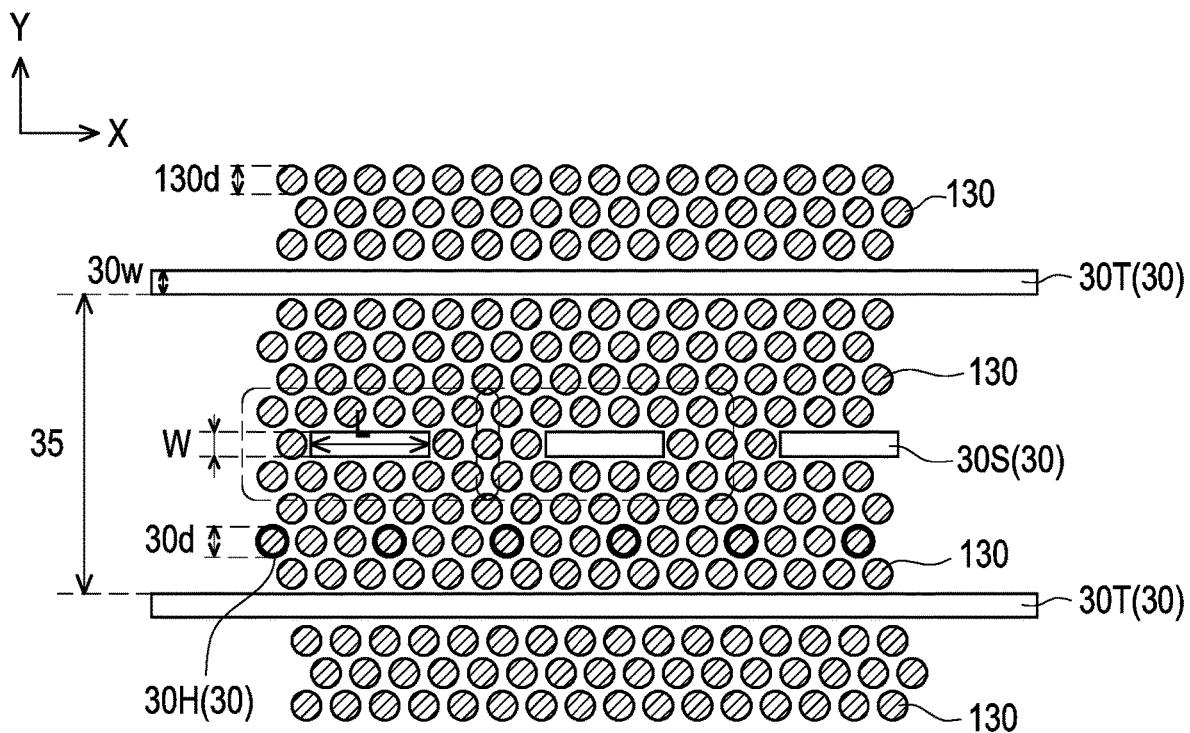

Although FIG. 8A to FIG. 10 illustrate that the shape of the slit holes 30H is a dot shape, the present invention is not limited thereto. In other embodiments, the shape of the slit holes 30S may also be a strip shape. Specifically, as shown in FIG. 11, an average length L of the plurality of slit openings 30S is greater than three times an average width W of the plurality of slit openings 30S, namely, L>3W. The average width W of the slit holes 30S may be greater than or equal to the average width $30w$ of the slit trenches 30T, namely, W≥$30w$. The average width W of the slit holes 30S may be greater than or equal to the average diameter $130d$ of the vertical channel structures 130, namely, W≥$130d$. In such embodiment, the strip-shaped slit holes 30S may be regarded as the slit trenches with a shorter length. Therefore, when the step of forming the opening 30 as shown in FIG. 2 is performed, the slit holes 30S can reduce the loading effect of this step, so that the slit holes 30S and the slit trench 30T can be stopped on the stop layer 108 almost simultaneously. In other words, the slit holes 30S and the slit trench 30T may have the same depth and cross-sectional profile.

Figure 12:
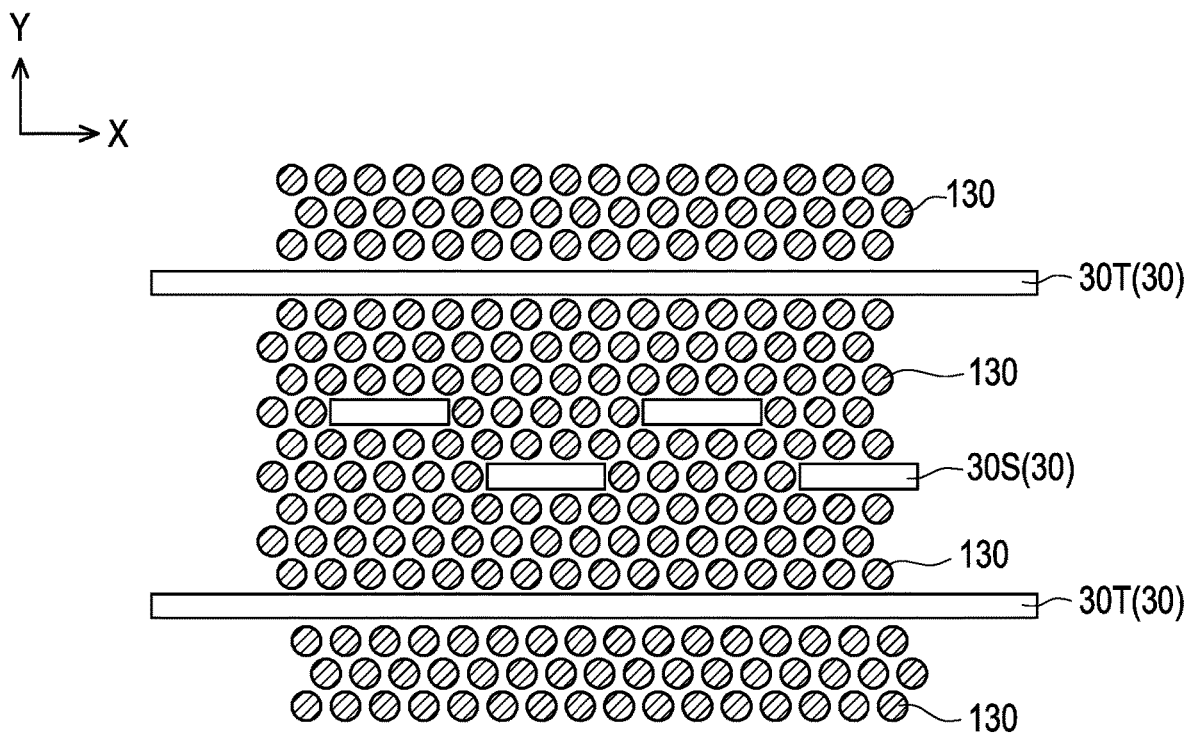

In addition, although FIG. 11 illustrates that the slit holes 30S are arranged in a single-line configuration along the X direction, the present invention is not limited thereto. In other embodiments, the slit holes 30S may also be arranged in a staggered configuration along the X direction, as shown in FIG. 12. In alternative embodiments, the slit holes 30S may also be arranged in a double-line configuration or a multi-line configuration along the X direction. In another example, the slit holes 30H of a dot shape and the slit holes 30S of a strip shape can be used in a same layout of the arrangements of slit holes, as shown in FIG. 11.

Figure 4A:
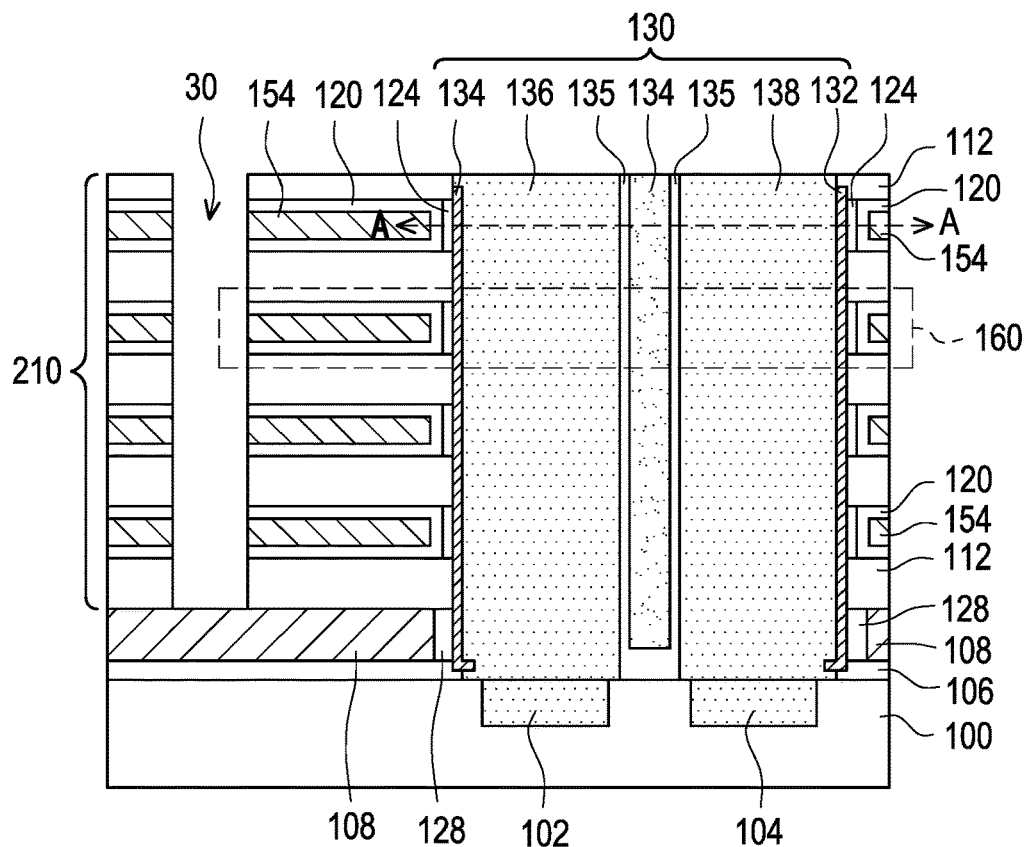
Figure 4B:
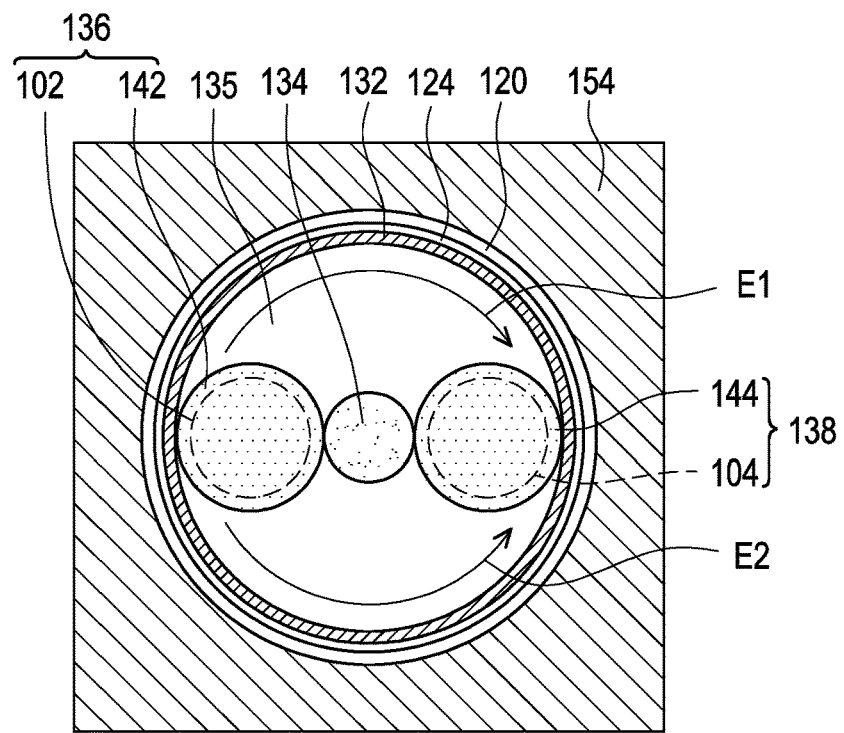
FIG. 4B is a schematic plan view along a line A-A of FIG. 4A.

Referring back to FIG. 4A and FIG. 4B, a charge storage layer 120 and the conductive layers 154 are sequentially formed in the gaps 34, thereby accomplishing a 3D AND flash memory 1 of the present invention. Specifically, as shown in FIG. 4A, the charge storage layer 120 conformally covers the gaps 34 to surround the conductive layers 154. In an embodiment, the charge storage layer 120 may be a composite layer of a tunneling layer, a charge storage layer and a block layer. The tunneling layer, the charge storage layer and the block layer may refer to oxide/nitride/oxide (ONO), respectively. In an embodiment, a material of the conductive layers 154 is, for example, polysilicon, amorphous silicon, tungsten (W), cobalt (Co), aluminum (Al), tungsten silicide ($WSi_x$), or cobalt silicide ($CoSi_x$). In addition, after forming the charge storage layer 120 and before forming the conductive layers 154, a buffer layer and a barrier layer may be sequentially formed between the charge storage layer 120 and the conductive layers 154. A material of the buffer layer is made of, for example, a material with a high dielectric constant of a dielectric constant greater than 7, such as aluminum oxide ($Al_2O_3$), hafnium oxide ($HfO_2$), lanthanum oxide ($La_2O_5$), transition metal oxide, lanthanide oxide, or a combination thereof. A material of the barrier layer is made of, for example, titanium (Ti), titanium nitride (TiN), tantalum (Ta), tantalum nitride (TaN), or a combination thereof.

In the present embodiment, the 3D AND flash memory 1 has a plurality of memory cells 160. In detail, as shown in FIG. 4A, in the 3D AND flash memory 1, there are 4 memory cells 160 stacked on each other. However, the present invention is not limited thereto, in other embodiments, the number of the memory cells 160 may be adjusted with the number of the conductive layers 154 in the stack structure 210. In addition, although FIG. 4A and FIG. 4B only illustrate a single vertical channel structure 130, the present invention is not limited thereto. In alternative embodiments, the 3D AND flash memory 1 may include a plurality of vertical channel structures 130, and these vertical channel structures 130 may be arranged as an array in a top view, as shown in FIG. 8A.

In order to operate the 3D AND flash memory 1, after the 3D AND flash memory 1 is manufactured, conductive lines are formed over the 3D AND flash memory 1 to be electrically connected to the 3D AND flash memory 1. In the present embodiment, some conductive lines formed over and electrically connected to the first S/D pillar 136 used as a source are used as source lines, and the other conductive lines formed over and electrically connected to the second S/D pillar 138 as a drain are used as bit lines, and these source and bit lines are arranged parallel to each other without contacting each other.

An operation of the memory cell 160 in the 3D AND flash memory 1 is described below.

For the 3D AND flash memory 1, each memory cell 160 may be operated individually. An operation voltage may be applied to the first S/D pillar 136, the second S/D pillar 138, and a corresponding conductive layer 154 (which may be regarded as gate or word line), to perform a writing (programming) operation, a reading operation, or an erasing operation. During read operation as shown in FIG. 4B, a voltage is applied to a selected conductive layer 154 (which may be regarded as gate or word line). When a voltage higher than a corresponding threshold voltage ($V_{th}$) of the corresponding memory cell 160 is applied, a channel region in channel layer 132 of the vertical channel structure 130, which intersects the selected conductive layer 154, is turned on. A current is allowed to enter the second S/D pillar 138 (referred as drain pillar) from the bit line and flows to the first S/D pillar 136 (referred as source pillar) via the turned-on channel region (e.g., in a direction indicated by arrow E1 & E2), and finally flow to the source line. Each memory cell 160 on the same vertical channel structure 130 are electrically connected in parallel.

Figure 5:
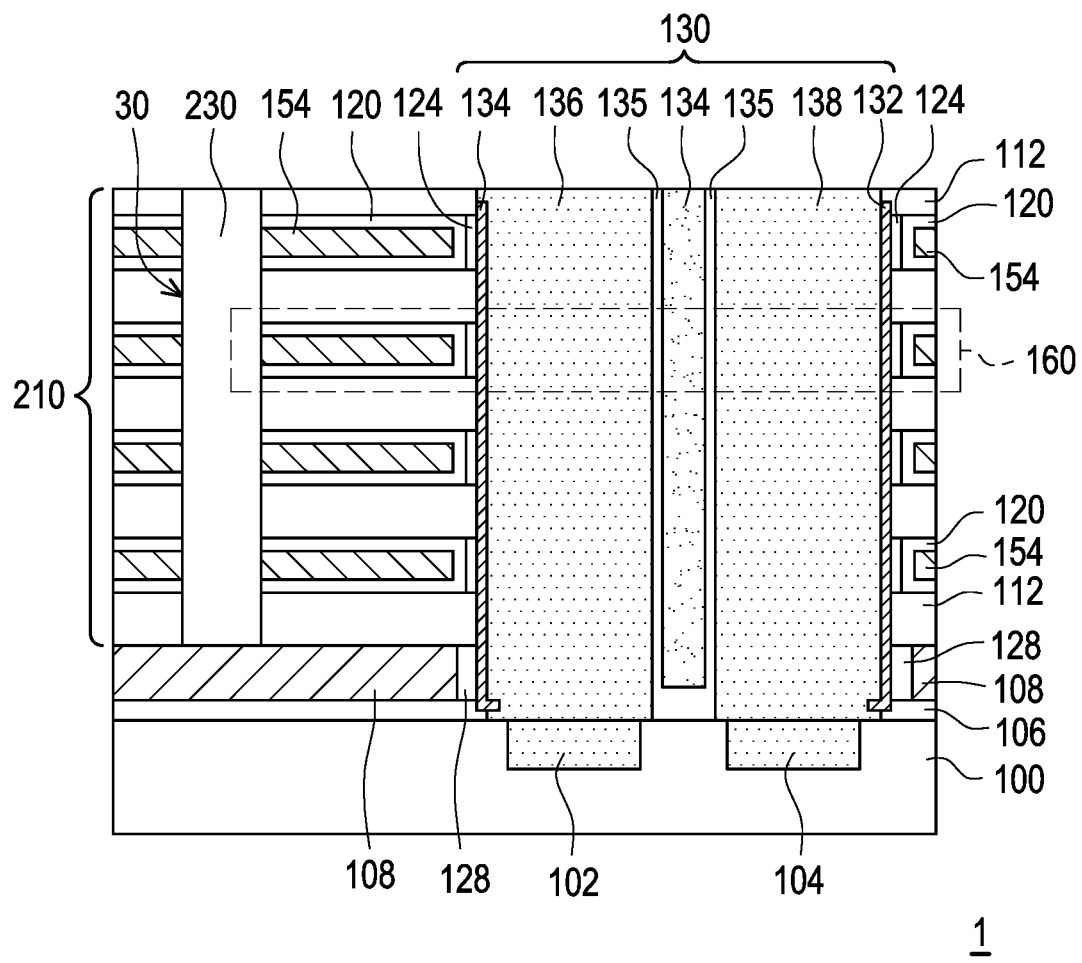

Referring to FIG. 5, after the gate replacement process is performed, a dielectric material may be formed to fill in the opening 30 and extend to cover a top surface of the stack structure 210. Then, a planarization process (e.g., CMP process) is performed to remove the excess dielectric material on the top surface of the stack structure 210, thereby forming a dielectric layer 230 in the opening 30. In this case, a top surface of the dielectric layer 230 may be coplanar with the top surface of the stack structure 210. In an embodiment, the dielectric material includes silicon oxide, silicon nitride, silicon oxynitride, or a combination thereof.

Figure 6:
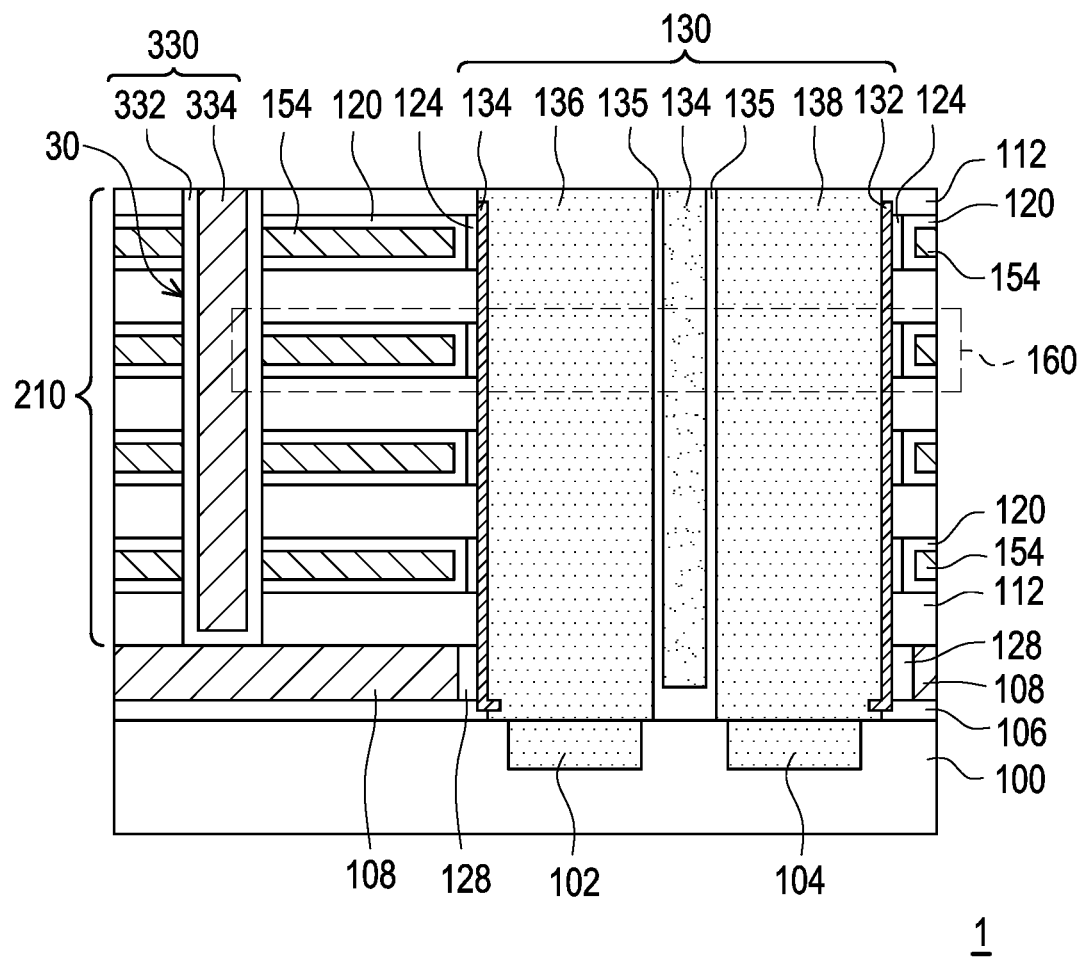
FIG. 6 is a schematic cross-sectional view of a 3D AND flash memory according to another embodiment of the invention.

In another embodiment, after the gate replacement process is performed, a dielectric material may be conformally formed to fill in the opening 30 and extend to cover a top surface of the stack structure 210. Afterward, a conductive material is formed on the dielectric layer. Then, a planarization process (e.g., CMP process) is performed to remove the excess dielectric material and conductive material on the top surface of the stack structure 210, thereby forming a composite structure 330 in the opening 30. In this case, a top surface of the composite structure 330 may be coplanar with the top surface of the stack structure 210. As shown in FIG. 6, the composite structure 330 includes a conductive feature 334 and a dielectric layer 332 wrapping the conductive feature 334. In an embodiment, the dielectric material includes silicon oxide, silicon nitride, silicon oxynitride, or a combination thereof, and the conductive material includes polysilicon, amorphous silicon, tungsten (W), cobalt (Co), aluminum (Al), tungsten silicide ($WSi_x$), or cobalt silicide ($CoSi_x$). In the present embodiment, the dielectric layer 332 may be used to electrically isolate the conductive feature 334 from the conductive layers 154 (or the stop layer 108).

Figure 7A:
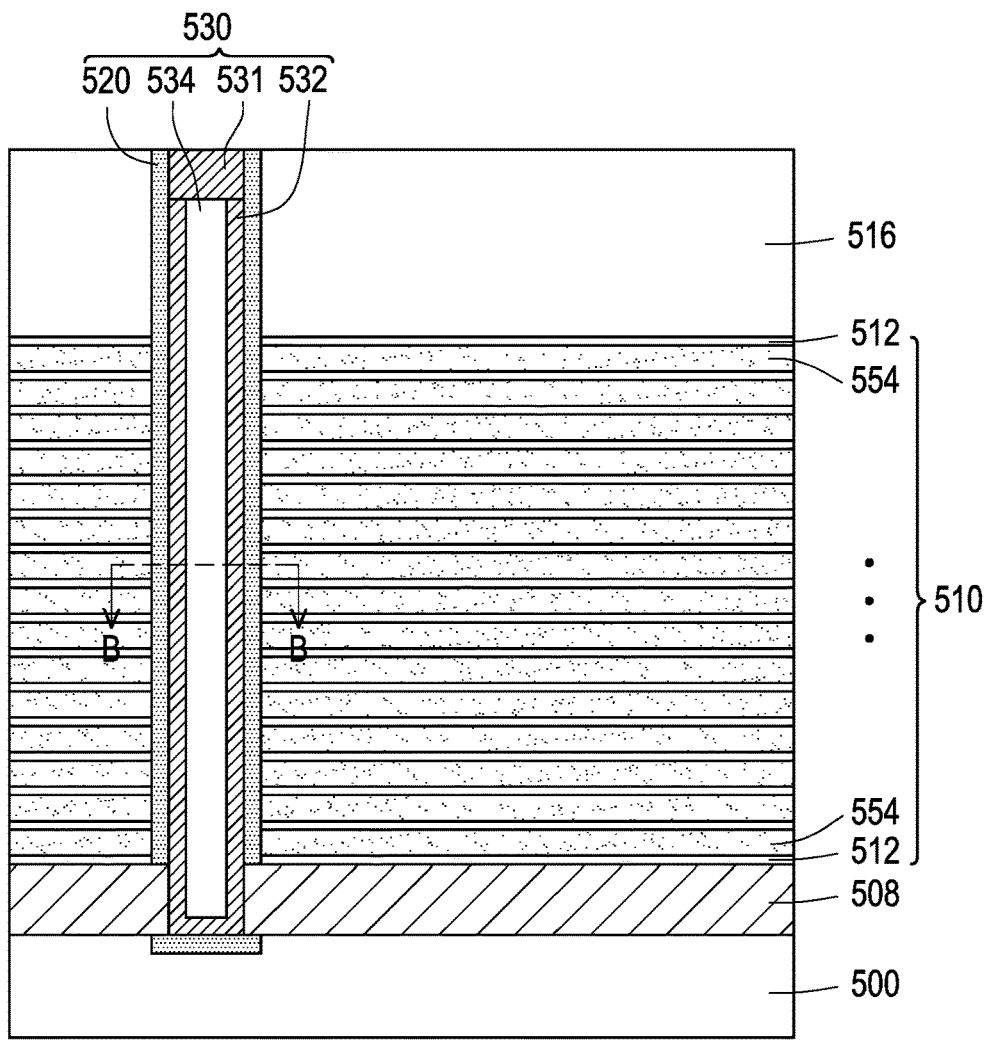
FIG. 7A is a schematic cross-sectional view of a 3D NAND flash memory according to other embodiments of the invention.
Figure 7B:
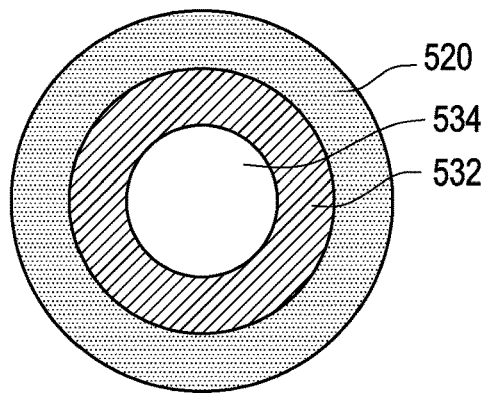
FIG. 7B is a schematic plan view along a line B-B of FIG. 7A.

FIGS. 7A and 7B are a schematic cross-sectional view and a top view of a 3D NAND flash memory according to other embodiments of the invention.

Referring to FIG. 7A, a 3D NAND flash memory 2 is illustrated. The 3D NAND flash memory 2 may include a substrate 500. A stop layer 508 is formed over substrate 500. The stop layer 508 includes a polysilicon layer, which acts as a common source plane (or common source line) for the 3D NAND flash memory 2. A stack structure 510 is formed over the stop layer 508. The stack structure 510 comprises a plurality of dielectric layers 512 and a plurality of conductive layers 554 stacked alternately. The conductive layers 554 may be regarded as gate or word line. A vertical channel structure 530 may include a charge storage layer 520, a channel layer 532 and an insulating pillar 534. As shown in FIG. 7A, the insulating pillar 534 may penetrate through a cap layer 516, the stack structure 510, and the stop layer 508, and partially extend into the substrate 500. The channel layer 532 physically contacts a conductive plug 531. The channel layer 532 may cover the sidewall and the bottom surface of the insulating pillar 534, and the conductive plug 531 may seal the top surface of the insulating pillar 534. In this case, the channel layer 532 may completely wrap all surfaces of the insulating pillar 534. The charge storage layer 520 may be disposed between the channel layer 532 and the stack structure 510. The charge storage layer 520 between the channel layer 532 and the stop layer 508 is removed. The charge storage layer 520 directly contacts the stop layer 508.

FIG. 7B is a plan view of the vertical channel structure 530 along axis B-B of FIG. 7A. The insulating pillar 534 is laterally surrounded the channel layer 532. The channel layer 532 is laterally surrounded the charge storage layer 520. The materials of the insulating pillar 534, channel layer 532 and the charge storage layer 520 are respectively the same as the insulating pillar 134, channel layer 132 and the charge storage layer 120 described in previous paragraphs.

In summary, in the present embodiment, a plurality of slit holes are discretely formed between the plurality of vertical channel structures to increase the removal efficiency of the sacrificial layers and the filling efficiency of the conductive layers in the gate replacement process, thereby improving the yield of the 3D flash memory. In this case, in the present embodiment, the process bottleneck of the current memory not only can be solved, but also increase the number of memory cells per chip area, thereby enhancing the integration and the area utilization of the memory.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A three-dimensional (3D) flash memory, comprising:
a substrate;
a stack structure, disposed on the substrate, wherein the stack structure comprises a plurality of dielectric layers and a plurality of conductive layers stacked alternately;
two adjacent slit trenches, penetrating through the stack structure, wherein the two adjacent slit trenches have an average width $30w$;
a plurality of vertical channel structures, disposed between the two adjacent slit trenches, and penetrating through the stack structure; and
a plurality of slit holes, discretely disposed between the plurality of vertical channel structures, and penetrating through the stack structure, wherein the plurality of slit holes have an average width W greater than or equal to the average width $30w$ of the two adjacent slit trenches.

2. The 3D flash memory according to claim 1, wherein the two adjacent slit trenches extend along a first direction and the plurality of slit holes are arranged along in the first direction.

3. The 3D flash memory according to claim 1, wherein the plurality of slit holes is a strip shape, an average length L of the plurality of slit holes being greater than three times the average width W thereof.

4. The 3D flash memory according to claim 1, wherein a distance between the two adjacent slit trenches is between 1 µm and 20 µm.

5. The 3D flash memory according to claim 1, wherein each of the plurality of vertical channel structures includes a first S/D pillar and a second S/D pillar laterally surrounded by a channel layer.

6. The 3D flash memory according to claim 1, further comprising a plurality of conductive features respectively disposed in the two slit trenches and the plurality of slit holes.

7. The 3D flash memory according to claim 1, wherein each of the plurality of vertical channel structures includes a channel layer laterally surrounded by a charge storage layer.

8. The 3D flash memory according to claim 1, wherein a shape of the plurality of slit holes in a top view includes a dot shape, a strip shape or a combination thereof.

9. The 3D flash memory according to claim 1, wherein when a shape of the plurality of slit holes is a dot shape, the plurality of slit holes have an average diameter greater than or equal to an average width of the two slit trenches, and the average diameter of the plurality of slit holes is greater than or equal to an average diameter of the plurality of vertical channel structures.

10. The 3D flash memory according to claim 1, wherein the average width of the plurality of slit holes is greater than or equal to an average diameter of the plurality of vertical channel structures.

11. The 3D flash memory according to claim 1, wherein the plurality of slit holes are arranged in a single-line configuration or a multi-line configuration in a top view.

12. A method of forming a three-dimensional (3D) flash memory, comprising:
forming a stop layer and a stack structure on a substrate, wherein the stack structure comprises a plurality of dielectric layers and a plurality of sacrificial layers stacked alternately;
forming a plurality of first openings in the stack structure and the stop layer;
respectively forming a plurality of vertical channel structures in the plurality of first openings;
forming a plurality of second openings exposing the stop layer in the stack structure, wherein the plurality of second openings at least comprise two adjacent slit trenches having an average width $30w$ and a plurality of slit holes having have an average width W, the plurality of vertical channel structures are formed between the two slit trenches, and the plurality of slit holes are discretely formed between the plurality of vertical channel structures, wherein the average width W of the plurality of slit holes is greater than or equal to the average width $30w$ of the two adjacent slit trenches; and
performing a gate replacement process through the plurality of second openings, so that the plurality of sacrificial layers are replaced by a plurality of conductive layers.

13. The method of forming the 3D flash memory according to claim 12, wherein the two slit trenches extend along a first direction and the plurality of slit holes are arranged along in the first direction.

14. The method of forming the 3D flash memory according to claim 12, wherein the plurality of slit holes is a strip shape, an average length L of the plurality of slit openings being greater than three times the average width W.

15. The method of forming the 3D flash memory according to claim 12, wherein each vertical channel structure comprises:
two source/drain (S/D) pillars, penetrating through the stack structure and the stop layer; and
a channel layer, surrounding the two S/D pillars.

16. The method of forming the 3D flash memory according to claim 12, wherein a shape of the plurality of slit holes in a top view includes a dot shape, a strip shape or a combination thereof.

17. The method of forming the 3D flash memory according to claim 12, wherein when a shape of the plurality of slit holes is a dot shape, the plurality of slit holes have an average diameter greater than or equal to an average width of the two slit trenches, and the average diameter of the plurality of slit holes is greater than or equal to an average diameter of the plurality of vertical channel structures.

18. The method of forming the 3D flash memory according to claim 12, wherein a removal limitation area of one of the plurality of slit holes for removing the plurality of sacrificial layers in the gate replacement process is partially overlapped with a removal limitation area of one of the two slit trenches for removing the plurality of sacrificial layers in the gate replacement process.

19. The method of forming the 3D flash memory according to claim 12, wherein a distance between the two adjacent slit trenches is between 1 µm and 20 µm.

20. The method of forming the 3D flash memory according to claim 12, wherein the average width of the plurality of slit holes is greater than or equal to an average diameter of the plurality of vertical channel structures.

* * * * *